United States Patent [19]
Yonenaga et al.

[11] Patent Number: 5,972,114
[45] Date of Patent: *Oct. 26, 1999

[54] FILM DEPOSITION APPARATUS WITH ANTI-ADHESION FILM AND CHAMBER COOLING MEANS

[75] Inventors: Tomihiro Yonenaga, Futaba-Cho; Mitsuhiro Tachibana, Ryuo-Cho; Sumi Tanaka, Hatta-Mura, all of Japan

[73] Assignee: Tokyo Electron Limited, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/610,860

[22] Filed: Mar. 5, 1996

[30] Foreign Application Priority Data

Mar. 10, 1995 [JP] Japan ................................. 7-79954

[51] Int. Cl.$^6$ .................................................. C23C 16/00
[52] U.S. Cl. ............................ 118/715; 118/724; 118/728
[58] Field of Search ..................................... 427/230, 237, 427/239, 248.1, 250, 576; 118/715, 724, 728; 392/416, 418

[56] References Cited

U.S. PATENT DOCUMENTS

| | | | |
|---|---|---|---|
| 4,146,774 | 3/1979 | Fraas | 219/271 |
| 4,592,924 | 6/1986 | Kuppers et al. | 427/45.1 |
| 4,923,715 | 5/1990 | Matsuda et al. | 427/237 |
| 5,000,113 | 3/1991 | Wang et al. | 118/723 E |
| 5,201,990 | 4/1993 | Chang et al. | 156/643 |
| 5,254,171 | 10/1993 | Hayakawa et al. | 118/723 MW |
| 5,366,585 | 11/1994 | Robertson et al. | 156/643 |
| 5,482,749 | 1/1996 | Telford et al. | 427/578 |
| 5,578,131 | 11/1996 | Ye et al. | 118/723 R |
| 5,616,208 | 4/1997 | Lee | 156/345 |
| 5,833,854 | 11/1998 | Ito et al. | 118/725 |

FOREIGN PATENT DOCUMENTS

| | | |
|---|---|---|
| 61-243176 | 10/1986 | Japan . |
| 62-189725 | 8/1987 | Japan . |
| 1-159368 | 6/1989 | Japan . |
| 3-21358 | 1/1991 | Japan . |
| 3-29324 | 2/1991 | Japan . |
| 4-17672 | 1/1992 | Japan . |
| 7-102366 | 4/1995 | Japan . |

OTHER PUBLICATIONS

Pierson, Handbook of Chemical Vapor Deposition, Noyes Publications, Park Ridge, New Jersey, pp. 149–151 and 225–226 (No Month), 1992.

English Abstract for Japanese Laid–Open Patent Publication (KOKAI) No. 1–59368, No date.

English Abstract for Japanese Laid–Open Patent Publication (KOKAI) No. 3–29324, no date.

English Abstract for Japanese Laid–Open Patent Publication (KOKAI) No. 4–17672, no date.

English Abstract for Japanese Laid–Open Patent Publication (KOKAI) No. 7–102366, no date.

Primary Examiner—Bruce Breneman
Assistant Examiner—Jeffrie R. Lund
Attorney, Agent, or Firm—Smith, Gambrell & Russell, LLP; Beveridge, DeGrandi, Weilacher & Young Intellectual Property Group

[57] ABSTRACT

An anti-adhesion film, which is difficult for the deposited film to adhere thereto, is formed on the inner surface of a process chamber. A process gas is supplied from a gas supply unit to that position in the process chamber which is opposed to a table, whereupon a metal film or metallic compound film is deposited on the surface of the object. In the film deposition process, the anti-adhesion film serves considerably to reduce the build-up of the metal film deposited on the inner surface of the process chamber, especially that surface of the gas supply unit which is opposed to the table. Although at least a maintenance operation such as wet cleaning is necessary, therefore, the frequency of such operation can be lowered substantially, so that the operating efficiency of the apparatus can be improved.

5 Claims, 4 Drawing Sheets

FIG. I

FILM DEPOSITION APPARATUS WITH ANTI-ADHESION FILM AND CHAMBER COOLING MEANS

BACKGROUND OF THE INVENTION

1. Field of the Invention

The present invention relates to a film deposition apparatus and a film deposition method for depositing, for example, a metal film.

2. Information of the Related Art

In a conventional process for manufacturing a semiconductor integrated circuit, a metal or metallic compound, such as W (tungsten), WSi (tungsten silicide), Ti (titanium), TiN (titanium nitride), or TiSi (titanium silicide), is deposited to form a film on the surface of a semiconductor wafer, as an object to be processed, in order to form a wiring pattern on the wafer surface or fill up indentations between wires and the like.

There are three known methods for depositing metal films of this type, $H_2$ (hydrogen) reduction method, $SiH_4$ (silane) reduction method, and $SiH_2Cl_2$ (dichlorosilane) reduction method. The $SiH_2Cl_2$ reduction method is a method in which a W or WSi film for a wiring pattern is deposited at a high temperature of about 600° C. by using dichlorosilane as a reducing gas. The $SiH_4$ reduction method is a method in which a W or WSi film for a wiring pattern is deposited at a lower temperature of about 370 to 400° C. by using silane as a reducing gas.

Further, the $H_2$ reduction method is a method in which a W film for filling up indentations or the like between interconnections on the wafer surface is deposited at a temperature of about 400 to 430° C. by using hydrogen as a reducing gas.

For example, $WF_6$ (tungsten hexafluoride) is used in any of the methods described above.

FIG. 4 shows a conventional film deposition apparatus for depositing a metal film. A thin table 4 formed of a carbon material or aluminum compound is arranged in a cylindrical process chamber 2 formed of aluminum or the like. Heater 8, e.g., halogen lamps, is located under the table 4 with a diathermanous window 6 of quartz between them.

Heat rays emitted from the heater 8 are transmitted through the diathermanous window 6, and reach and heat the table 4, thereby indirectly heating to and keeping a semiconductor wafer W on the table at a predetermined temperature. At the same time, a process gas, e.g., $WF_6$ or $SiH_4$, is fed equally onto the wafer surface from a shower head 10 which is located over the table 4, whereupon a metal film of W or Wsi is deposited on the wafer surface.

In this case, the metal film is deposited not only on the wafer surface, but also on structures in the process chamber, e.g., the chamber wall, shower head surface, and clamp ring (not shown) and other members surrounding the wafer. If the resulting deposited film is separated, it is reduced to particles and causes reduction in the yield of wafer production. To avoid this, the deposit film of extra W or WSi adhering to the surfaces of the internal structures is removed by introducing $ClF_3$ as a cleaning gas after the process of every predetermined number of wafers, e.g., 25 wafers.

As the wafers are carried into or from the process chamber, a small quantity of water gets into the chamber. Oxygen generated by the resolution of the entrapped water reacts with tungsten to form an oxide. Thereupon, the oxide adheres to the bottom face of shower head 10 which is exposed to a specially high temperature.

This tungsten oxide is a stable substance which cannot be thoroughly removed by the $ClF_3$ gas which is used in dry cleaning. It is necessary, therefore, to disassemble the whole apparatus and carry out wet cleaning after the process of, for example, every 1,000 wafers. Thus, the frequency of such an elaborate maintenance operation is increased, so that the operating efficiency of the apparatus is lowered substantially.

Disclosed in Japanese Patent Laid-open Publication (Kokai) No. 3-29324 is a plate which has good adhesion to a metal film and the like, and is attached to the inner wall of a process chamber, whereby the maintenance operation is eased. However, this plate is formed of a metal, such as stainless steel, and positively captures a deposit film which produces particles, thus failing to be a very effective measure to solve the problem.

SUMMARY OF THE INVENTION

The object of the present invention is to provide a film deposition apparatus and a film deposition method, in which an anti-adhesion film is formed on the surface of a shower head or the like so that the frequency of a wet cleaning operation can be lowered.

According to the present invention, there is provided a film deposition apparatus for depositing a metal film or metallic compound film on the surface of an object to be processed, comprising:

a chamber structure, defining a process chamber for depositing the film on the object, and including a table for carrying thereon the object in the process chamber;

a gas supply unit for supplying a process gas to that position in the process chamber which is opposed to the table, thereby depositing the metal film or metallic compound film on the surface of the object; and an anti-adhesion film, formed on the inner surface in the process chamber, and making it difficult for the deposited film to adhere thereon.

In summary, according to the present invention, the anti-adhesion film serves considerably to reduce the build-up of the metal film (or metallic compound film, to be repeated in the following) deposited on the inner surface in the process chamber, especially that surface of the gas supply unit which is opposed to the table, in a film deposition process. The principle on which the build-up of the metal film can be reduced will be described later.

Although at least a maintenance operation such as wet cleaning is necessary, therefore, the frequency of such operation can be lowered substantially, so that the operating efficiency of the apparatus can be improved.

In this case, the deposition of the metal film can be further restrained, when the chamber structure, e.g., the gas supply unit, is formed from a material with good thermal conductivity, and it is provided with cooling means for cooling the surface of the gas supply unit.

An oxide, such as quartz, alumina, or Alumite (anodized aluminum), may be used for the anti-adhesion film. A quartz film, in particular, can efficiently restrain the adhesion or deposition of the metal film.

Furthermore, the structure in the process chamber, e.g., a wall which defines the process chamber, may be formed of the aforesaid material, e.g., alumina, which is difficult for the deposited object to adhere.

DETAILED DESCRIPTION OF THE PREFERRED EMBODIMENTS

Preferred embodiments of the present invention will become understood from the following detailed description referring to the accompanying drawings.

Figure 1:
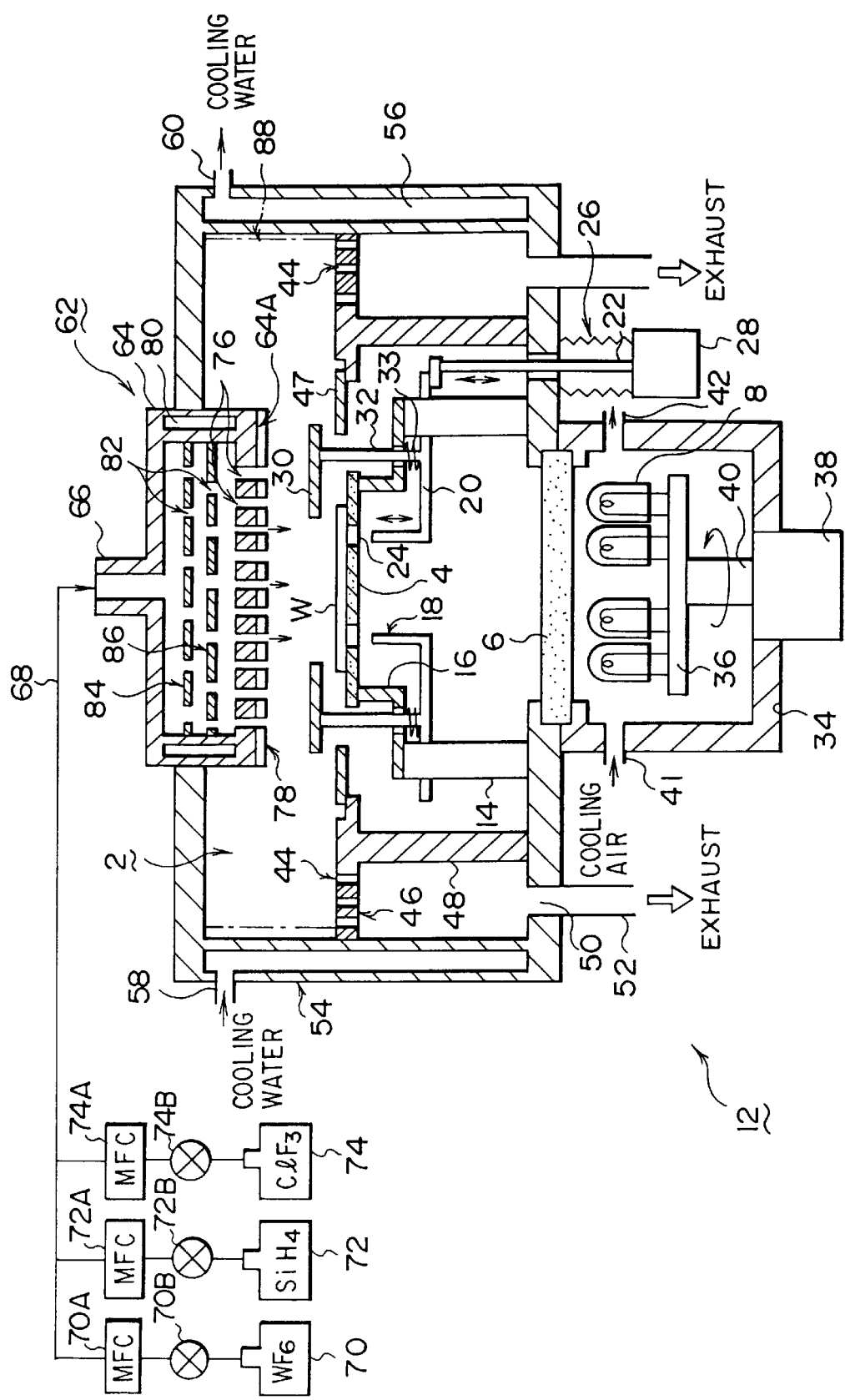
FIG. 1 is a sectional view showing one embodiment of a film deposition apparatus according to the present invention.
Figure 2:
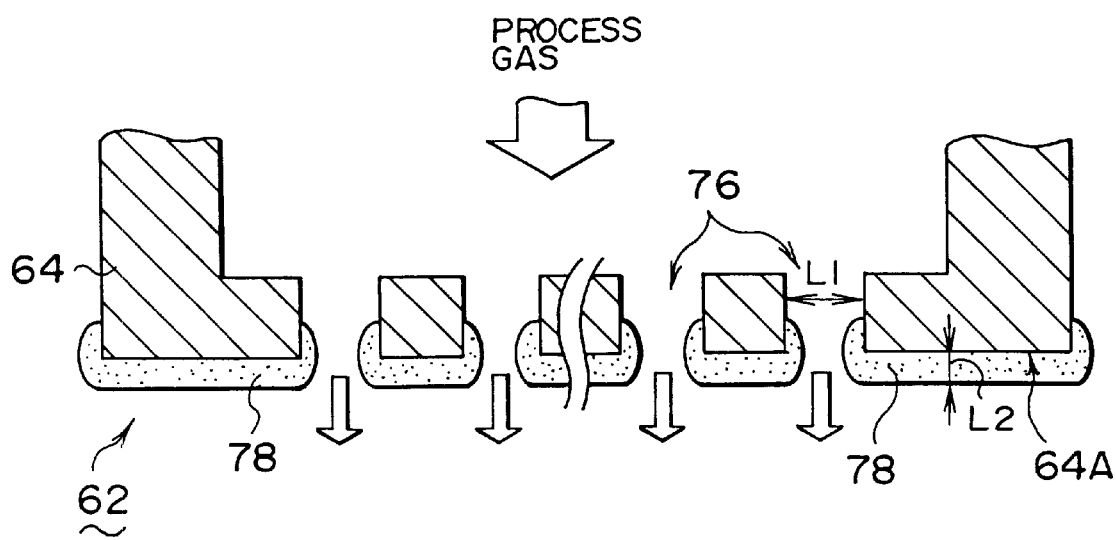
FIG. 2 is an enlarged view showing a gas supply section of the apparatus shown in FIG. 1.
Figure 4:
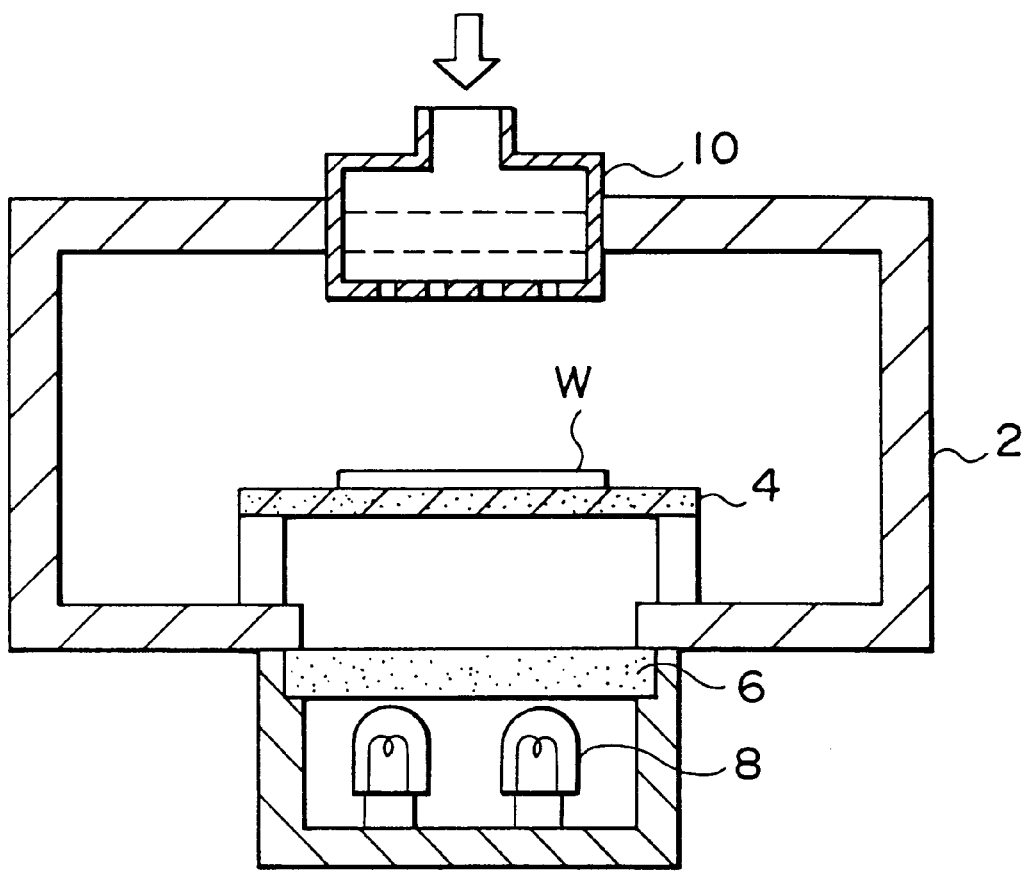
FIG. 4 is a schematic sectional view showing a conventional film deposition apparatus for depositing a metal film.

FIGS. 1 and 2 show one embodiment of a film deposition apparatus 12 according to the present invention, and FIG. 4 shows a prior art film deposition apparatus. Like reference numerals are used to designate like portions throughout the drawings.

The film deposition apparatus 12 comprises a cylindrical or box-shaped process chamber 2 formed of, e.g., aluminum. In the process chamber 2, a table 4 for carrying thereon a semiconductor wafer W as an object to be processed is mounted, by means of a retaining member 16 having, e.g., an L-shaped profile, on a support post 14 which is set up on the base of the process chamber. The support post 14 and the retaining member 16 are formed of a diathermanous material, e.g., quartz, while the table 4 is formed of a carbon material, aluminum compound or other material with a thickness of about 1 mm.

Under the table 4, a plurality of lifter pins 18, e.g., three pins, protrude upward from a support member 20. As the support member 20 is moved up and down by means of a push-up rod 22 which penetrates the base of the process chamber 2, the wafer W can be lifted by passing the lifter pins 18 through lifter pin holes 24 which are bored through the table 4.

The lower end of the push-up rod 22 is connected to an actuator 28 by means of a flexible bellows 26 in order to keep the process chamber 2 airtight inside.

Located over the peripheral edge portion of the table 4 is a ceramic clamp ring 30 which is used to hold the peripheral edge portion of the wafer W and fix it to the table 4. The clamp ring 30 is coupled to the retaining member 16 by means of support rods 32 which loosely penetrate the member 16, and is liftable integrally with the lifter pins 18. A coil spring 33 is fitted on that portion of each support rod 32 which is situated between the retaining member 16 and the support member 20, whereby the clamp ring 30 and the like are assisted in descending, and clamping of the wafer W. The lifter pins 18, support member 20, and a retaining member 16 are also formed of a diathermanous material, such as quartz.

An airtight diathermanous window 6 of a diathermanous material, such as quartz, is provided at the bottom portion of the process chamber 2. A box-shaped heating chamber 34 underlies the diathermanous window 6 so as to surround it. In the heating chamber 34, a plurality of heater lamps 8, e.g., four lamps, for use as a heater, are mounted on a turntable 36 which doubles as a reflector. The turntable 36 is rotated about a rotating shaft 40 by means of a rotating motor 38 which is mounted on the base of the process chamber 2. Heat rays emitted from the heater lamps 8 can be transmitted through the diathermanous window 6 to irradiate the underside of the table 4, thereby heating the table 4.

The side wall of the heating chamber 34 is provided with a cooling air inlet port 41, through which cooling air for cooling the inside of the chamber 34 and the diathermanous window 6, and a cooling air outlet port 42, through which the air is discharged.

A ring-shaped flow regulator plate 46 having a large number of flow regulator holes 44 is located around the table 4 so as to be supported by an annular support column 48. Provided on the inner peripheral side of the flow regulator plate 46 is a ring-shaped quartz attachment 47 which comes into contact with the outer peripheral portion of the clamp ring 30, thereby preventing gas from flowing down. Exhaust ports 50 are bored through that portion of the base of the process chamber 2 which is situated under the flow regulator plate 46. The exhaust ports 50 are connected individually with exhaust pipes 52 which are connected to a vacuum pump (not shown), whereby the process chamber 2 can be kept at a predetermined degree of vacuum (e.g., 100 to $10^{-6}$ Torr).

A compartment wall 54 which defines the process chamber 2 is provided with a process chamber cooling jacket 56 which is formed by hollowing out the wall 54. The jacket 56 is provided with an inlet port 58 and an outlet port 60 for cooling water, whereby the inner wall of the process chamber 2 is cooled lest deposits adhere to the wall.

On the other hand, the top portion of the process chamber 2 which faces the table 4 is provided with a gas supply unit 62 which serves to introduce necessary gases, such as process and cleaning gases, into the chamber 2. More specifically, the gas supply unit 62 is in the form of a shower head, including a circular box-shaped head body 64 of, e.g., aluminum. A gas inlet port 66 is formed in the top portion of the head body 64.

The gas inlet port 66 is connected with process gas sources 70 and 72 for $WF_6$ and $SiH_4$ and a cleaning gas source 74 for $ClF_3$ by means of a gas pipe 68 and a plurality of branch pipes, individually. Flow control valves 70A, 72A and 74A and on-off valves 70B, 72B and 74B are inserted in the branch pipes, individually. As a reducing gas, $H_2$ gas may be used in place of $SiH_4$.

The side wall of the head body 64 is provided with a water cooling jacket 80 for use as cooling means which is formed by hollowing out the side wall in the shape of a ring. The jacket 80 serves to cool the surface of the head body 64, especially that side which faces the table 4.

A bottom face 64A of the head body 64 which faces the table 4 has a large number of gas holes 76 through which the gas fed into the head body is discharged. The gas holes 76 are distributed uniformly in the same plane so that the gas can be discharged uniformly over the wafer surface.

As is also shown in FIG. 2, the bottom face 64A of the head body 64 is entirely covered by an anti-adhesion film 78 which is difficult for the deposited film to adhere thereon and constitutes a feature of the present invention. The anti-adhesion film 78 may be formed of an insulating material, e.g., an oxide such as quartz ($SiO_2$), alumina, or Alumite (anodized aluminum) obtained without the use of sodium. In consideration of the manufacturing cost and the like, quartz should be used with first priority. According to the present embodiment, therefore, quartz is used for the anti-adhesion film 78. The quartz film 78 may be formed by the ion-plating method in which the aluminum head body 64 is used as an electrode, for example. However, the way of forming the film 78 is not limited to this method.

Figure 3:
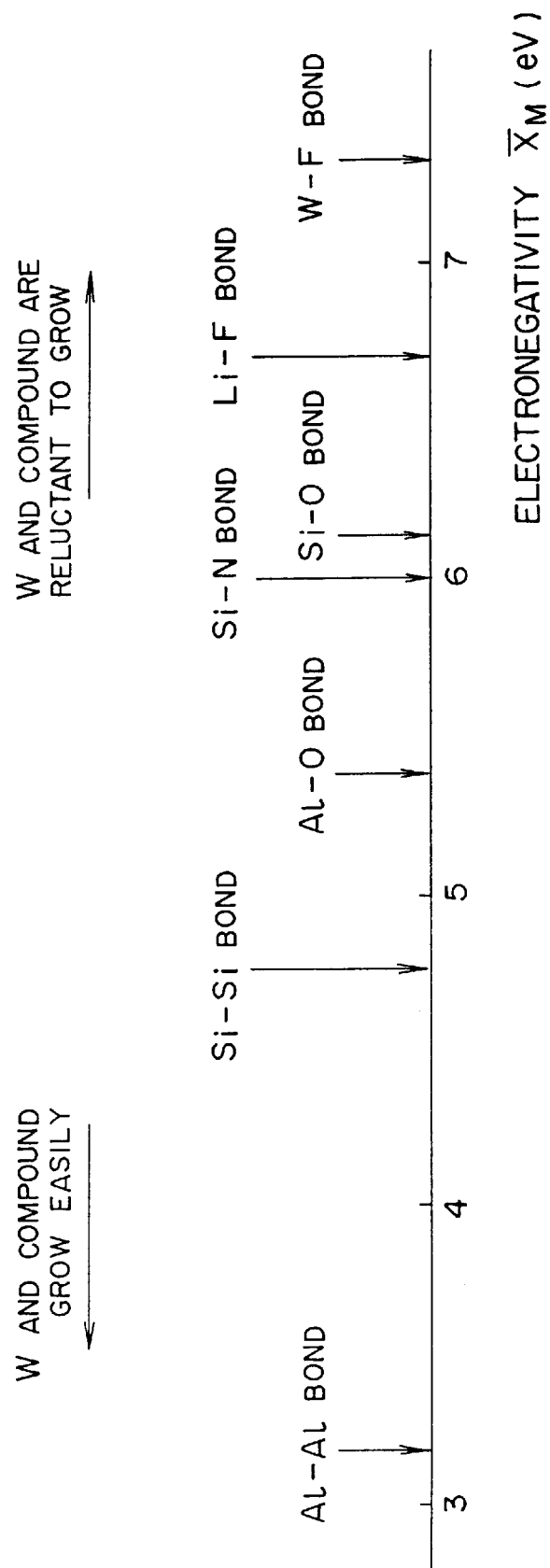
FIG. 3 is a diagram, based on electronegativity, for explaining the reason why the ease of growth of tungsten varies depending on the substrate material.

Referring now to FIG. 3, the reason will be described why a film of a metal or the like cannot easily adhere to the anti-adhesion film 78 which is formed of an insulating material (e.g., oxide).

A material gas which combines $SiH_4$ or $H_2$ with $WF_6$ is used in the CVD selective growth of tungsten. In this system, there are two coexisting reactions for the formation of nuclei of tungsten which serve as the starting points of growth. In one of these reactions, the nuclei of tungsten are deposited in a manner such that electrons are supplied from a substrate to $WF_6$ which is adsorbed by the surface of an electrically conductive material so that fluorine is dissociated. This reaction is bound for an electrically conductive material which involves electrons, and is also a cause for the selective growth. In the other reaction, the nuclei of tungsten are deposited in a manner such that $WF_6$ is decomposed by reduction with $SiH_4$ or $H_2$. Any substrate material is available for this second reaction. Although both these reactions are caused on the conductive material, the reaction based on the electron supply is the principal one.

On the insulating material, on the other hand, nuclei of tungsten repeatedly develop and disappear. When supersaturated tungsten finds a point of adsorption, the nuclei starts to grow even if no electrons are supplied from the substrate. However, the frequency of formation of nuclei is low, and it is a long time before the growth starts. Accordingly, it is hard for a film of a metal or the like to adhere to the anti-adhesion film 78 which is formed of an insulating material (e.g., oxide).

The reason why the time required before the start of the growth varies depending on the substrate material can be qualitatively explained on the basis of Mulliken's electronegativity. In a comparative test on four different insulating materials, tungsten grew on $Al_2O_3$, $Si_3N_4$, $SiO_2$, and LiF with priority of ease in the order named. This priority order agrees with the fact that the lower the electronegativity of the material, the easier the growth of tungsten is, as shown in FIG. 3. Since there is no definition indicative of the electronegativity of a compound, a value obtained by halving the sum of the respective electronegativities of the elements is used herein according to Mulliken's proposal. Thus, it is also positively evident that a film of a metal or the like cannot easily adhere to the anti-adhesion film 78 which is formed of an insulating material (e.g., oxide).

Further, the diameter (L1) of each gas hole 76 is as large as about 1.1 mm, while the thickness (L2) of the film 78 is much smaller, ranging from about 3 to 5 $\mu$m. In forming the anti-adhesion film 78, therefore, there is no possibility of the gas holes 76 being blocked up.

In order to prevent the adhesion of the film, it may be advisable to form the whole head body 64 from quartz. In this case, however, the bottom face 64A of the head body 64 which faces the table 4 cannot be fully cooled and is heated unduly, thus inevitably allowing adhesion of many deposits, since quartz has low thermal conductivity. Preferably, therefore, the head body 64 should be formed from a material with good thermal conductivity, such as aluminum, in consideration of the cooling efficiency.

Two diffuser plates 84 and 86, each having a large number of gas dispersion holes 82, are arranged in layers, upper and lower, in the head body 64, whereby the gas can be supplied more uniformly to the wafer surface.

The following is a description of the operation of the present embodiment constructed in this manner.

First, in depositing a metal film on the wafer surface, a gate valve (not shown) attached to the compartment wall of the process chamber 2 is opened, and the wafer W is carried into the chamber 2 by means of a transfer arm and delivered to the lifter pins 18 by pushing up the pins 18. Then, the push-up rod 22 is lowered to lower the lifter pins 18, thereby placing the wafer W on the table 4, and the rod 22 is further lowered to cause the peripheral edge portion of the wafer W to be pressed and fixed by the clamp ring 30.

Subsequently, $WF_6$ and $SiH_4$ are supplied as process gases from the process gas sources 70 and 72 to the gas supply unit 62 and mixed therein. The gas mixture is fed equally into the process chamber 2 through the gas holes 76 in the bottom face of the head body 64. The rates of feed of $WF_6$ and $SiH_4$ range from 5 to 100 SCCM and from 10 to 300 SCCM, respectively, for example. At the same time, the process chamber 2 is evacuated to a predetermined degree of vacuum within the range of, e.g., 1 to 50 Torr by sucking out the internal atmosphere from the chamber 2 through the exhaust ports 50. Also, the heater lamps 8 in the heating chamber 34 are rotated as they are driven to release heat energy.

After the emitted heat rays are transmitted through the diathermanous window 6, they are also transmitted through the quartz support member 20 and the like, and irradiate and heat the underside of the table 4. The table 4, which is as thin as about 1 mm, as mentioned before, can be heated with speed, so that the wafer W on the table 4 can be quickly heated to a predetermined temperature.

The supplied gas mixture undergoes a specific chemical reaction, whereupon a tungsten film is deposited on the wafer surface, for example. As this is done, the bottom face of the head body (shower head) 64, which faces the wafer surface, is exposed to a relatively high temperature, so that a deposit film is also liable to adhere to this region.

According to the present embodiment, however, the anti-adhesion film 78 is formed on the bottom face of the head body 64, so that the adhesion of the deposit film can be prevented. This anti-adhesion effect is particularly good for a film of a metallic oxide, such as $WO_X$ (tungsten oxide), deposited as a result of the resolution of water on the wafer surface which is introduced into the process chamber 2 as the wafer W is carried into the chamber.

This film deposition process is executed for each wafer. More specifically, one wafer is discharged after it is treated, and another untreated wafer is carried in and subjected to film formation. Every time one batch or 25 wafers, for example, are treated, $ClF_3$ as a cleaning gas is introduced into the process chamber 2, and deposit films adhering to the surfaces of the structures in the chamber 2, such as the bottom face of the head body 64, inner surface of the compartment wall of the chamber 2, etc., are removed by cleaning. Although films of a metal (W) and metallic silicide (WSi) can be removed relatively easily with use of the cleaning gas or $ClF_3$, in this cleaning process, the metallic oxide ($WO_X$) film cannot be removed with ease because of its stability.

According to the present embodiment, however, the anti-adhesion film 78 of, e.g., $SiO_2$, serves to retard the adhesion of a metallic oxide film. Even after the process of a large number of wafers, therefore, the apparatus requires only dry cleaning using a conventional cleaning gas, such as $ClF_3$. Thus, the frequency of thorough wet cleaning, which is entailed by the adhesion of a metallic oxide film, can be lowered substantially, so that the operating efficiency of the apparatus can be improved considerably.

In the case of a blanketing process for filling up indentations on the wafer surface, not a film deposition process for wiring pattern formation, in particular, a film with a thickness of 1,000 to 8,000 angstrom is deposited on each wafer, so that the amount of deposits adhering to the bottom face of the head body 64 is great. Owing to the function of the anti-adhesion film 78, however, the build-up of the metallic oxide film, which cannot be easily removed by means of the ClF$_3$ gas, as mentioned before, is very small. Also in this case, therefore, the frequency of the wet cleaning operation, which requires disassembly of the apparatus itself, can be lowered, so that the operating efficiency of the apparatus can be improved.

A comparative test was conducted on the conventional apparatus and the apparatus of the present invention. After 1,000 wafers were subjected to the film deposition process in the conventional apparatus, a yellow tungsten oxide film was found to be deposited over the bottom face of the head body. In the apparatus of the present invention, on the other hand, the bottom face of the head body was found in its initial state without any substantial tungsten oxide thereon after the process of 1,500 wafers.

Thus, by previously forming the anti-adhesion film 78 of quartz or the like on the bottom face 64A of the head body 64 while effectively cooling the head body 64, the adhesion of the metallic oxide film, which cannot be easily removed by means of a conventional cleaning gas, such as ClF$_3$, can be restrained considerably. In consequence, the frequency of the wet cleaning process, which involves elaborate maintenance and inspection operations, can be lowered considerably.

According to the embodiment described above, the material of the metal film to be deposited on the wafer surface is tungsten or tungsten silicide. However, the present invention is not limited to this embodiment, and may be also applied to the cases where films of some other metals, such as Ti (titanium), TiN (titanium nitride), TiSi (titanium silicide), etc., are deposited on the wafer surface.

According to the above-described embodiment, moreover, aluminum is used as the material of the head body 64, and its bottom face 64A is covered by a quartz film as an anti-adhesion material. Alternatively, however, the whole head body 64 may be formed of an anti-adhesion material such as alumina (Al$_2$O$_3$).

Moreover, the region which is covered by the anti-adhesion film 78 is not limited to the bottom face of the head body which faces the table. Alternatively, the anti-adhesion film may be formed on any other structure in the process chamber, e.g., the inner surface of the compartment wall which defines the process chamber, as indicated by dashed line 88 in FIG. 1.

According to the film deposition apparatus and the film deposition method of the present invention, as described herein, the following excellent effects can be produced.

Since the anti-adhesion film is formed on the surface of some structure in the process chamber, e.g., the bottom face of the shower head or the compartment wall surface, the adhesion of the metallic oxide film, which cannot be removed by dry cleaning, can be restrained.

Accordingly, the frequency of maintenance operation, such as the wet cleaning process in which the apparatus is disassembled to remove the metallic oxide film, can be lowered, so that the operating efficiency of the apparatus can be improved considerably.

Further, the deposition of the metallic oxide film can be restrained to improve the operating efficiency of the apparatus by forming the head body from a base material with good thermal conductivity and providing it with the cooling means, as well as by forming the anti-adhesion film on the head body.

Even in the case where the structure in the process chamber is formed of an anti-adhesion material such as alumina, furthermore, the same effects as aforesaid can be produced.

While the presently preferred embodiment of the present invention has been shown and described, it is to be understood that this disclosure is for the purpose of illustration and that various changes and modifications may be made without departing from the scope of the invention as set forth in the appended claims.

What is claimed is:

1. A film deposition apparatus for depositing a metal film or metallic compound film on a surface of an object to be processed, comprising:

a chamber structure, defining a process chamber for depositing the film on the object, and including a table for carrying thereon the object in said process chamber;

a gas supply unit for supplying a process gas to that position in said process chamber which is opposed to said table, thereby depositing the metal film or metallic compound film on the surface of the object; and an anti-adhesion film, formed on a surface in said process chamber, and making it difficult for the deposited film to adhere thereon, wherein said anti-adhesion film is one of SiO$_2$, and LiF.

2. The film deposition apparatus according to claim 1, wherein said gas supply unit has said surface having said anti-adhesion film, said surface with said anti-adhesion film being opposed to said table.

3. The film deposition apparatus according to claim 1, wherein said structure includes a compartment wall defining the process chamber.

4. The film deposition apparatus according to claim 1, wherein said metal film or metallic compound film contains tungsten or titanium.

5. A film deposition apparatus according to claim 1, further comprising cooling means for cooling the inner wall of said chamber structure, said cooling means comprising a coolant passage formed in the side wall of said chamber structure.

* * * * *